United States Patent
Kato et al.

(10) Patent No.: US 8,232,608 B2
(45) Date of Patent: Jul. 31, 2012

(54) SEMICONDUCTOR DEVICE AND METHOD FOR MANUFACTURING SEMICONDUCTOR DEVICE

(75) Inventors: Yoshiko Kato, Yokohama (JP);
Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 326 days.

(21) Appl. No.: 12/501,726

(22) Filed: Jul. 13, 2009

(65) Prior Publication Data

US 2010/0013028 A1    Jan. 21, 2010

(30) Foreign Application Priority Data

Jul. 15, 2008 (JP) ................................. 2008-183704

(51) Int. Cl.
*H01L 27/088* (2006.01)
(52) U.S. Cl. ................. 257/392; 257/E27.061
(58) Field of Classification Search .................. 257/392, 257/E27.061
See application file for complete search history.

(56) References Cited

U.S. PATENT DOCUMENTS

| | | | |
|---|---|---|---|
| 6,255,700 B1 * | 7/2001 | Yoshida et al. | 257/380 |
| 6,314,021 B1 * | 11/2001 | Maeda et al. | 365/185.01 |
| 7,144,790 B2 | 12/2006 | Shin | |
| 2003/0071308 A1 * | 4/2003 | Yoshida | 257/348 |
| 2005/0093047 A1 * | 5/2005 | Goda et al. | 257/300 |

FOREIGN PATENT DOCUMENTS

JP     2005-353892     12/2005

OTHER PUBLICATIONS

U.S. Appl. No. 12/497,857, filed Jul. 6, 2009, Masato Endo.
U.S. Appl. No. 12/484,526, filed Jun. 15, 2009, Masato Endo, et al.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

A semiconductor device with a high-voltage transistor and a low-voltage transistor includes an isolation insulating film between a first element region of the high-voltage transistor and a second element region of the low-voltage transistor, a first gate insulating film on a semiconductor substrate in the first element region, a first gate electrode on the first gate insulating film, a second gate insulating film on the semiconductor substrate in the second element region, and a second gate electrode on the second gate insulating film. The isolation insulating film includes a first isolation region adjacent to a surrounding area of the first element region and a second isolation region adjacent to a surrounding area of the second element region. A bottom of the second isolation region is lower than a bottom of the first isolation region. The first gate insulating film is thicker than the second gate insulating film.

5 Claims, 19 Drawing Sheets

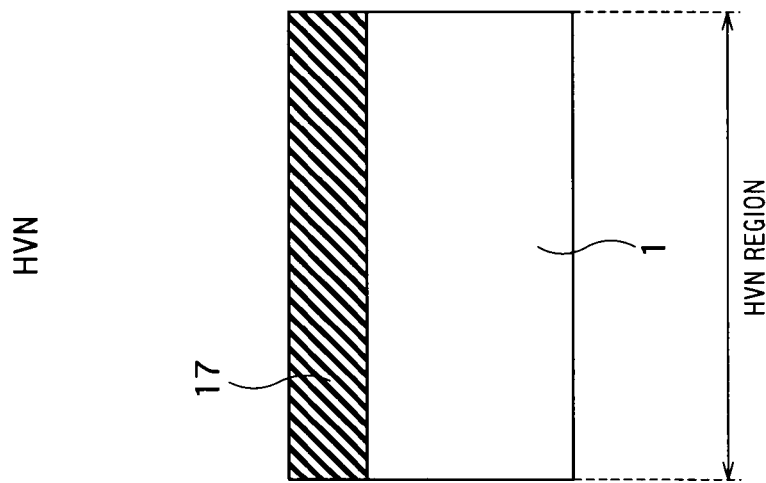
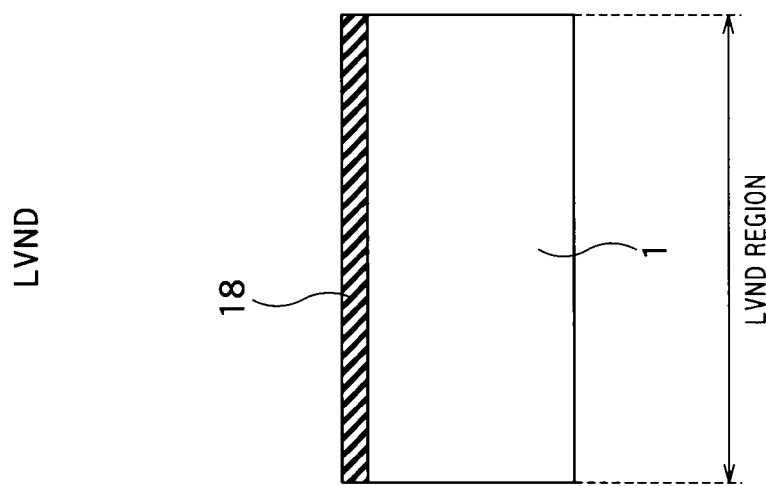
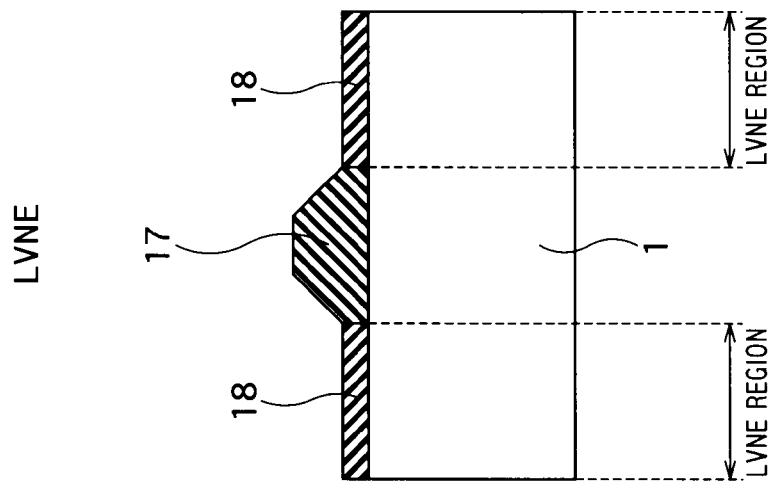

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from the prior Japanese Patent Application No. 2008-183704, filed on Jul. 15, 2008; the entire contents of which are incorporated herein by reference.

BACKGROUND OF THE INVENTION

1. Field of the Invention

The present invention relates to a semiconductor device and a method for manufacturing the semiconductor device, particularly to a semiconductor device with a high-voltage transistor and a low-voltage transistor and to a method for manufacturing the semiconductor device.

2. Related Art

Recently, with the advance of a shrinking of a semiconductor device, a low-viscosity material is used as an isolation insulating film buried between element regions. However, when the low-viscosity material is buried between element regions, a crystal defect is generated in the element region by a stress. The crystal defect causes junction leakage in semiconductor elements such as a MOS (Metal Oxide Semiconductor) transistor. The crystal defect causes a problem in not only an n-type low-voltage transistor but also a p-type low-voltage transistor.

It is well known that the crystal defect has a relationship with a depth of the isolation insulating film (see JP-A No. 2005-353892). Further, the crystal defect tends to cause a problem in an element region of a low-voltage transistor having the small element region, due to a gate length of the transistor.

However, many semiconductor devices having different film thicknesses of the gate insulating films are manufactured in nonvolatile memories. When the element region of the low-voltage transistor is lower than that of the isolation insulating film adjacent to an element region of a high-voltage transistor, the junction leakage of the low-voltage transistor is easy to generate due to the crystal defect.

BRIEF SUMMARY OF THE INVENTION

According to a first aspect of the present invention, there is provided a semiconductor device with a high-voltage transistor and a low-voltage transistor, comprising:

an isolation insulating film between a first element region of the high-voltage transistor and a second element region of the low-voltage transistor;
a first gate insulating film on a semiconductor substrate in the first element region;
a first gate electrode on the first gate insulating film;
a second gate insulating film on the semiconductor substrate in the second element region; and
a second gate electrode on the second gate insulating film,
wherein the isolation insulating film comprises a first isolation region adjacent to a surrounding area of the first element region and a second isolation region adjacent to a surrounding area of the second element region, a bottom of the second isolation region being lower than a bottom of the first isolation region, and the first gate insulating film being thicker than the second gate insulating film.

According to a second aspect of the present invention, there is provided a method for manufacturing a semiconductor device with a low-voltage transistor and a high-voltage transistor, comprising:

forming a first gate insulating film on a semiconductor substrate;
removing the first gate insulating film on the semiconductor substrate in the low-voltage transistor;
forming a second gate insulating film thinner than the first gate insulating film on the semiconductor substrate in the low-voltage transistor;
forming gate layers on the first and second gate insulating films;
making a first opening adjacent to the semiconductor substrate in the high-voltage transistor and a second opening adjacent to the semiconductor substrate in the low-voltage transistor, a distance from a bottom of the semiconductor substrate to a bottom of the first opening is greater than a distance from a bottom of the semiconductor substrate to a bottom of the second opening; and
burying the opening by an isolation insulating film,
wherein, the making the opening comprises etching to the semiconductor substrate, the gate layer, the first gate insulating film, and the second gate insulating film with a mask material as a mask, the mask material covering an element region included in the low-voltage transistor, and changing an etching condition in such a manner that the semiconductor substrate is etched easier than the first and second gate insulating films to etch the first gate insulating film and the semiconductor substrate.

According to a third aspect of the present invention, there is provided a method for manufacturing a semiconductor device with a low-voltage transistor and a high-voltage transistor, comprising:

forming a first gate insulating film on a semiconductor substrate;
removing the first gate insulating film on the semiconductor substrate in the low-voltage transistor;
forming a second gate insulating film thinner than the first gate insulating film on the semiconductor substrate in the low-voltage transistor;
forming gate layers on the first and second gate insulating films;
making a first opening in the semiconductor substrate under the first gate insulating film and a second opening in the semiconductor substrate under the second gate insulating film in a self-aligned manner, a distance from a bottom of the semiconductor substrate to a bottom of the second opening is greater than a distance from a bottom of the semiconductor substrate to a bottom of the first opening; and
burying the opening by an isolation insulating film.

BRIEF DESCRIPTION OF THE DRAWINGS

FIGS. 13A to 13C illustrate a cross-section showing a process after the process of FIGS. 12A to 12C.

DETAILED DESCRIPTION OF THE INVENTION

Embodiments of the present invention will be described below with reference to the drawings. The following embodiments are described only by way of example, and the scope of the invention is not limited to the embodiments.

First Embodiment

A semiconductor device according to a first embodiment of the present invention will be described. The semiconductor device of the first embodiment of the present invention is manufactured such that a volume of a whole isolation insulating film is reduced by reducing an area of a deeper isolation region (including a lower bottom) in the isolation insulating film adjacent to an element region of a low-voltage transistor.

The semiconductor device of the first embodiment of the present invention is a nonvolatile memory by way of example. The nonvolatile memory includes a high-voltage transistor in which a gate insulating film ranging from 30 nm to 100 nm, and a low-voltage transistor in which a gate insulating film ranging from 5 nm to 10 nm, for example the low-voltage transistor used as a logic circuit.

A structure of the semiconductor device of the first embodiment of the present invention will be described with reference to FIGS. 1 and 2.

Figure 1:
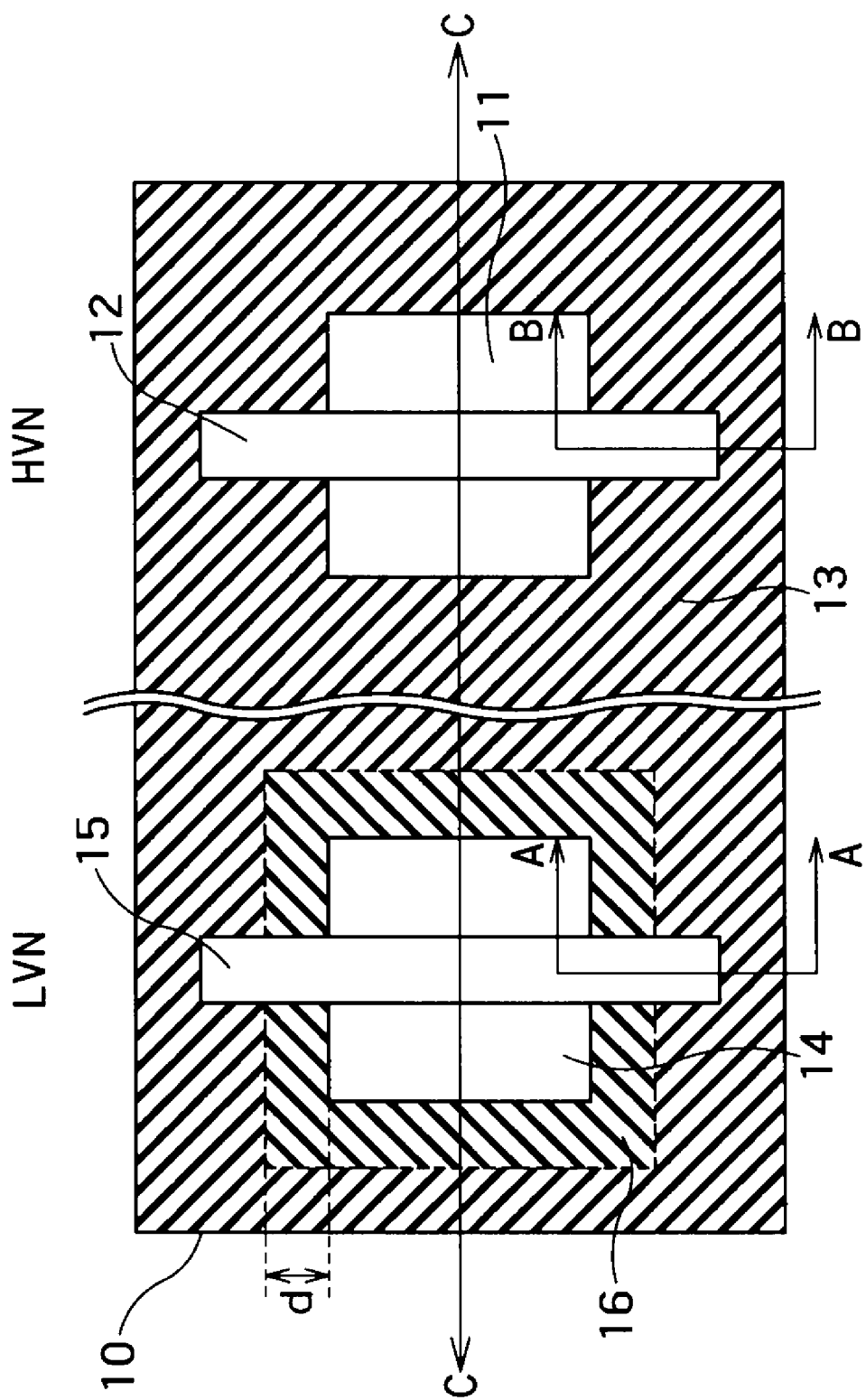
FIG. 1 is a plan view illustrating a planar structure of the semiconductor device of a first embodiment of the present invention.

FIG. 1 is a plan view illustrating a planar structure of the semiconductor device of the first embodiment of the present invention.

The semiconductor device is a nonvolatile memory including a high-voltage transistor HVN and a low-voltage transistor LVN.

The high-voltage transistor HVN includes a first element region 11 surrounded by an isolation insulating film and a first gate electrode 12 disposed so as to extend from the first element region 11 onto a first isolation region 13. The first element region 11 is surrounded by the first isolation region 13.

The low-voltage transistor LVN includes a second element region 14 surrounded by the isolation insulating film and a second gate electrode 15 disposed so as to extend from the second element region 14 onto the first isolation region 13. The isolation insulating film includes a second isolation region 16 disposed adjacent to the second element region 14 and the first isolation region 13 disposed so as to surround a second isolation region 16.

The low-voltage transistor LVN includes an enhancement type transistor (hereinafter referred to as "E-type transistor") and a depletion type transistor (hereinafter referred to as "D-type transistor"). In such cases, preferably a size of the second isolation region 16 of the D-type transistor is larger than that of the second isolation region 16 of the E-type transistor.

Figure 2A:
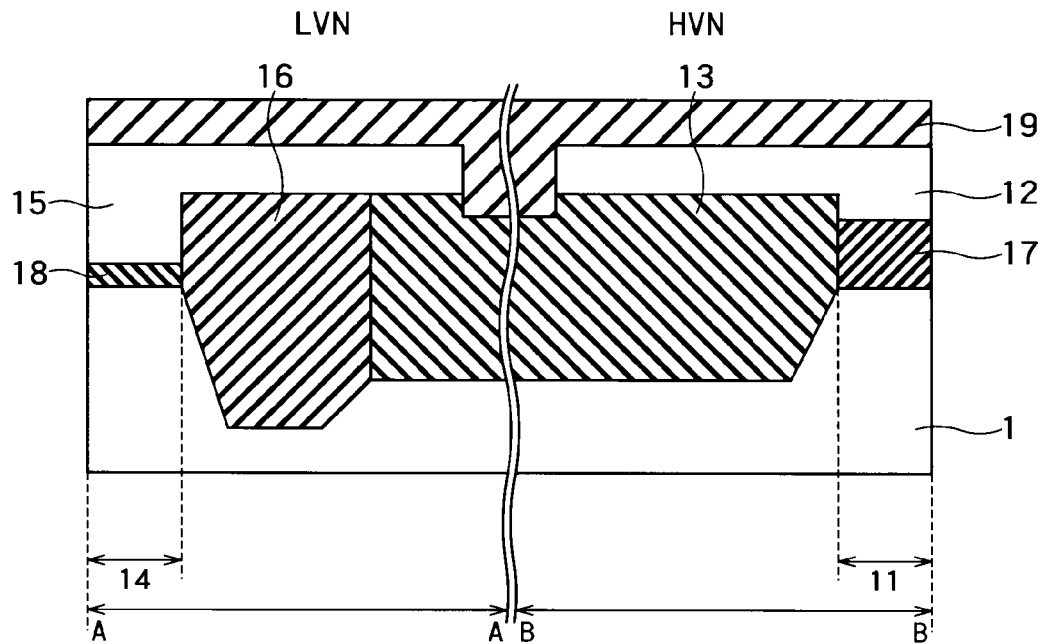
FIG. 2A illustrates cross-sections taken along the line A-A and line B-B of FIG. 1.
Figure 2B:
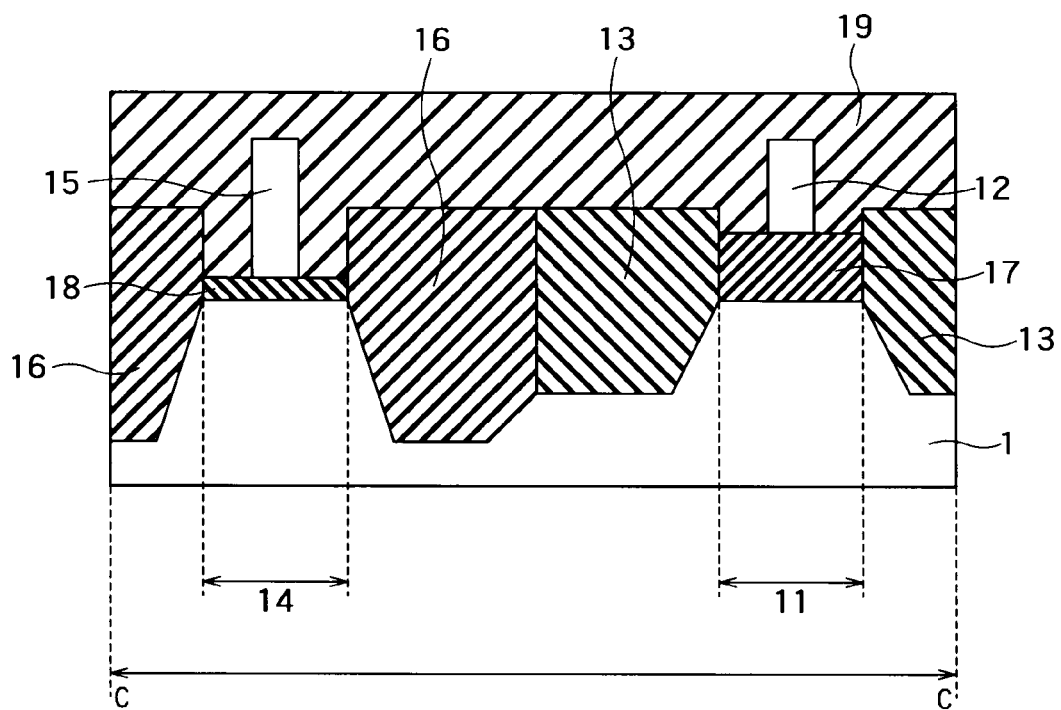
FIG. 2B illustrates a cross-section taken along the line C-C of FIG. 1.

FIGS. 2A and 2B are cross-sectional views taken along a line A-A, a line B-B, and a line C-C of FIG. 1. FIG. 2A illustrates cross-sections taken along the line A-A and line B-B of FIG. 1, and FIG. 2B illustrates a cross-section taken along the line C-C of FIG. 1.

The isolation insulating film including the first isolation region 13 and the second isolation region 16 is formed in a semiconductor substrate 1. The first element region 11 of the high-voltage transistor HVN and the second element region 14 of the low-voltage transistor LVN are surrounded by the isolation insulating film. The first gate electrode 12 is formed on the first element region 11 with a first gate insulating film 17 interposed therebetween. The second gate electrode 15 is formed on the second element region 14 with a second gate insulating film 18 interposed therebetween. The first gate electrode 12 and the second gate electrode 15 are formed so as to partially extend onto the isolation insulating film. An interlayer dielectric film 19 is formed on the first gate electrode 12, the second gate electrode 15, and a part of the isolation insulating film in which the first gate electrode 12 and the second gate electrode 15 are not formed.

In the high-voltage transistor HVN, the first isolation region 13 is formed adjacent to the first element region 11. A film thickness of the first gate insulating film 17 is thicker than that of the second gate insulating film 18.

In the low-voltage transistor LVN, the second isolation region 16 is formed adjacent to the second element region 14.

A bottom of the second isolation region 16 is lower than that of the first isolation region 13. That is, a distance from the bottom to a top of the second isolation insulator region 16 is greater than that of the first isolation region 13. The second isolation region 16 is adjacent to the first element region 13. The bottom of the first isolation region 13 and the second isolation region 16 is gradually low from the first isolation region 13 to the second region 16.

A method for producing the semiconductor device of the first embodiment of the present invention will be described with reference to FIGS. 3 to 10.

Figure 3:
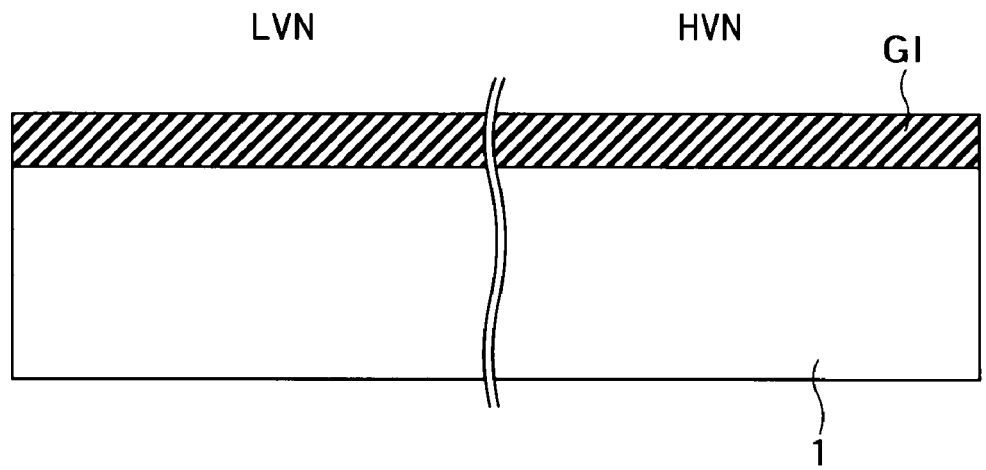
FIG. 3 illustrates a cross-section showing a process of a method for manufacturing a semiconductor device of a first embodiment of the present invention.

As illustrated in FIG. 3, a gate insulating film GI is formed in a whole surface of the semiconductor substrate 1. For example, the whole surface of the semiconductor substrate 1 is oxidized, or an insulating film is deposited on the semiconductor substrate 1 by a CVD method, whereby forming the gate insulating film GI.

Figure 4:
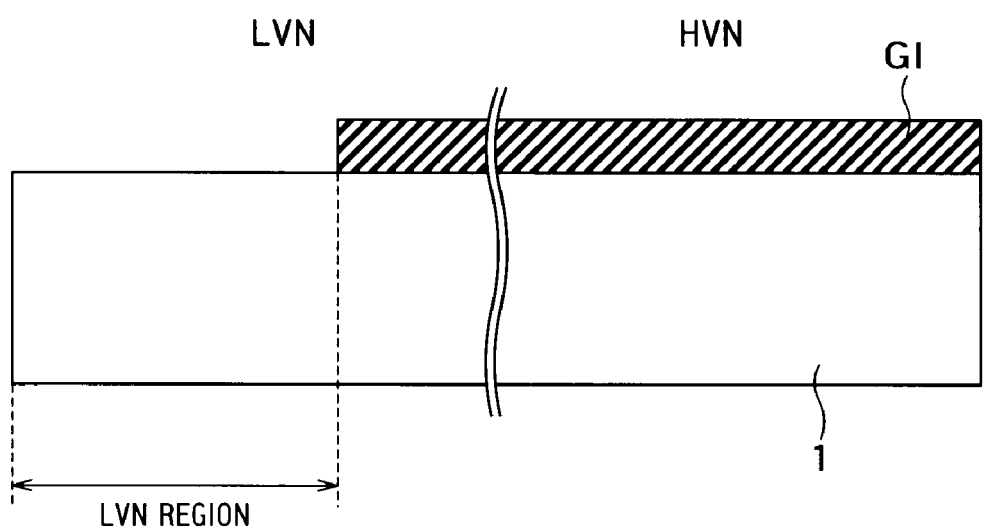
FIG. 4 illustrates a cross-section showing a process after the process of FIG. 3.

As illustrated in FIG. 4, using an etching technique, the gate insulating film GI on the semiconductor substrate 1 is removed in a region (hereinafter referred to as "LVN region") where the low-voltage transistor LVN is formed.

Figure 5:
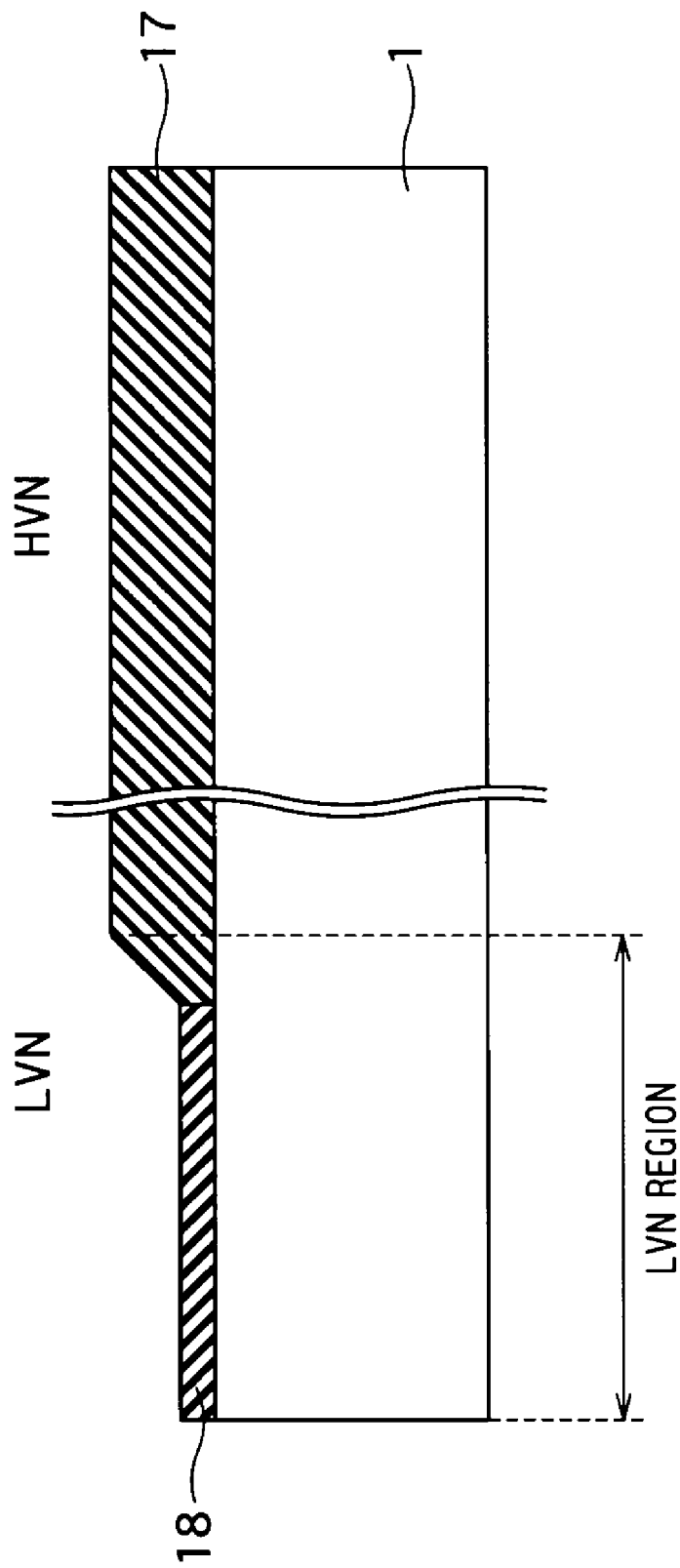
FIG. 5 illustrates a cross-section showing a process after the process of FIG. 4.

As illustrated in FIG. 5, an additional gate insulating film GI is formed on the semiconductor substrate 1 in the LVN region. For example, the additional gate insulating film GI is formed by depositing the insulating film using the CVD method. At this time, the additional gate insulating film GI is deposited on the semiconductor substrate 1 and the gate insulating film GI of FIG. 4. As a result, the film thickness of the gate insulating film GI is increased to constitute the first gate insulating film 17. The gate insulating film GI formed on the semiconductor substrate 1 constitutes the second gate insulating film 18. At this time, the film thickness of the first gate insulating film 17 is similar to the film thicknesses of the additional gate insulating film GI and gate insulating film GI formed in the process of FIG. 3, and the film thickness of the second gate insulating film 18 is similar to the film thickness of the additional gate insulating film. As a result, the first gate insulating film 17 is thicker than the second gate insulating film 18. Bottoms of the first gate insulating film 17 and the second gate insulating film 18 are substantially flush with each other. That is, a level is even in the whole surface of the semiconductor substrate 1. The additional gate insulating film GI may be formed by a thermal oxidation method instead of the CVD method.

Figure 6:
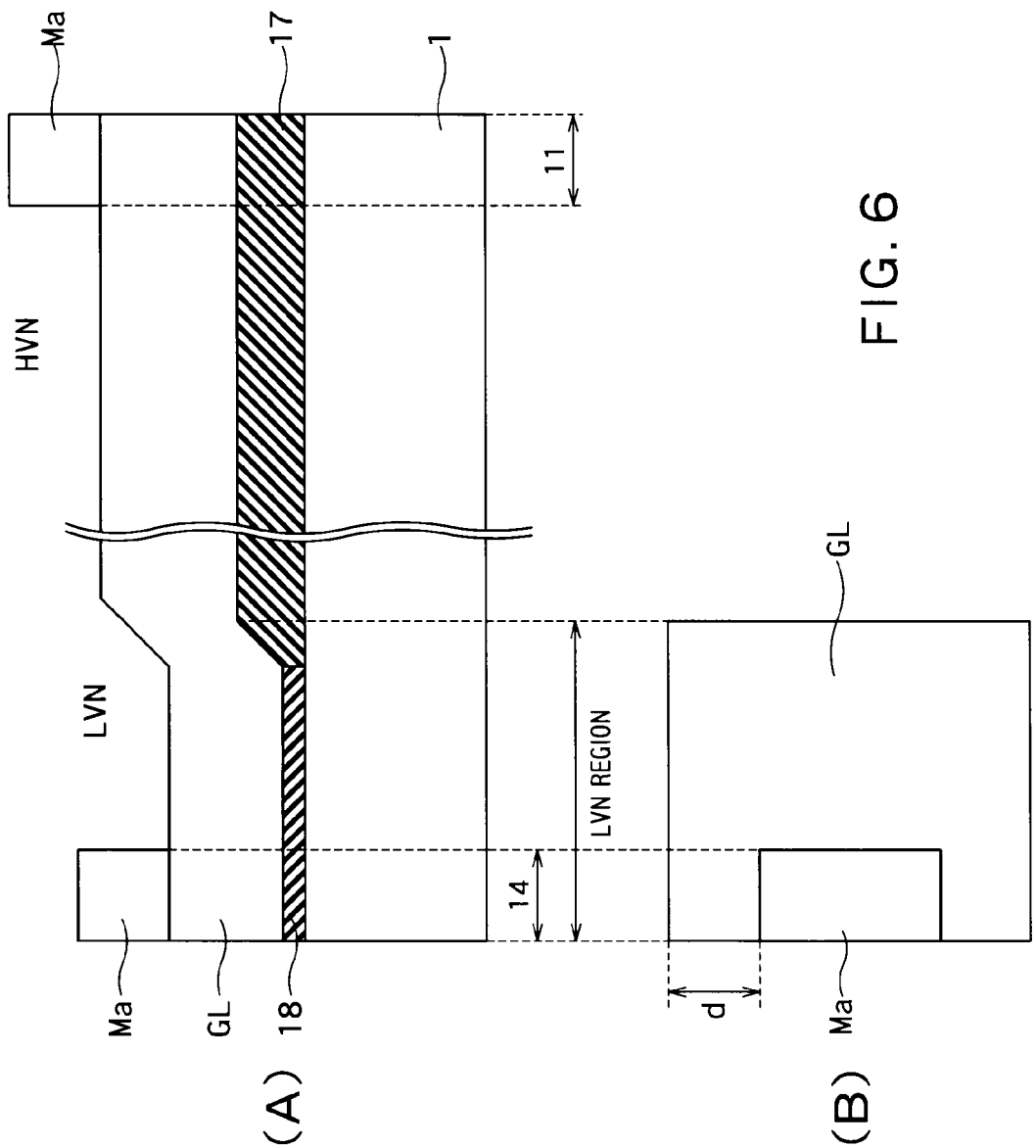
FIG. 6 illustrates a cross-section showing a process after the process of FIG. 5.

As illustrated in (A) and (B) FIG. 6, a gate layer GL made of, for example, polycrystalline silicon is formed in the whole surface of the semiconductor substrate 1. Then, mask materials Ma are formed in regions where the first element region 11 of the high-voltage transistor HVN and the second element region 14 of the low-voltage transistor LVN are formed. As a result, the second element region 14 of the low-voltage transistor LVN is surrounded by the LVN region.

Figure 7:
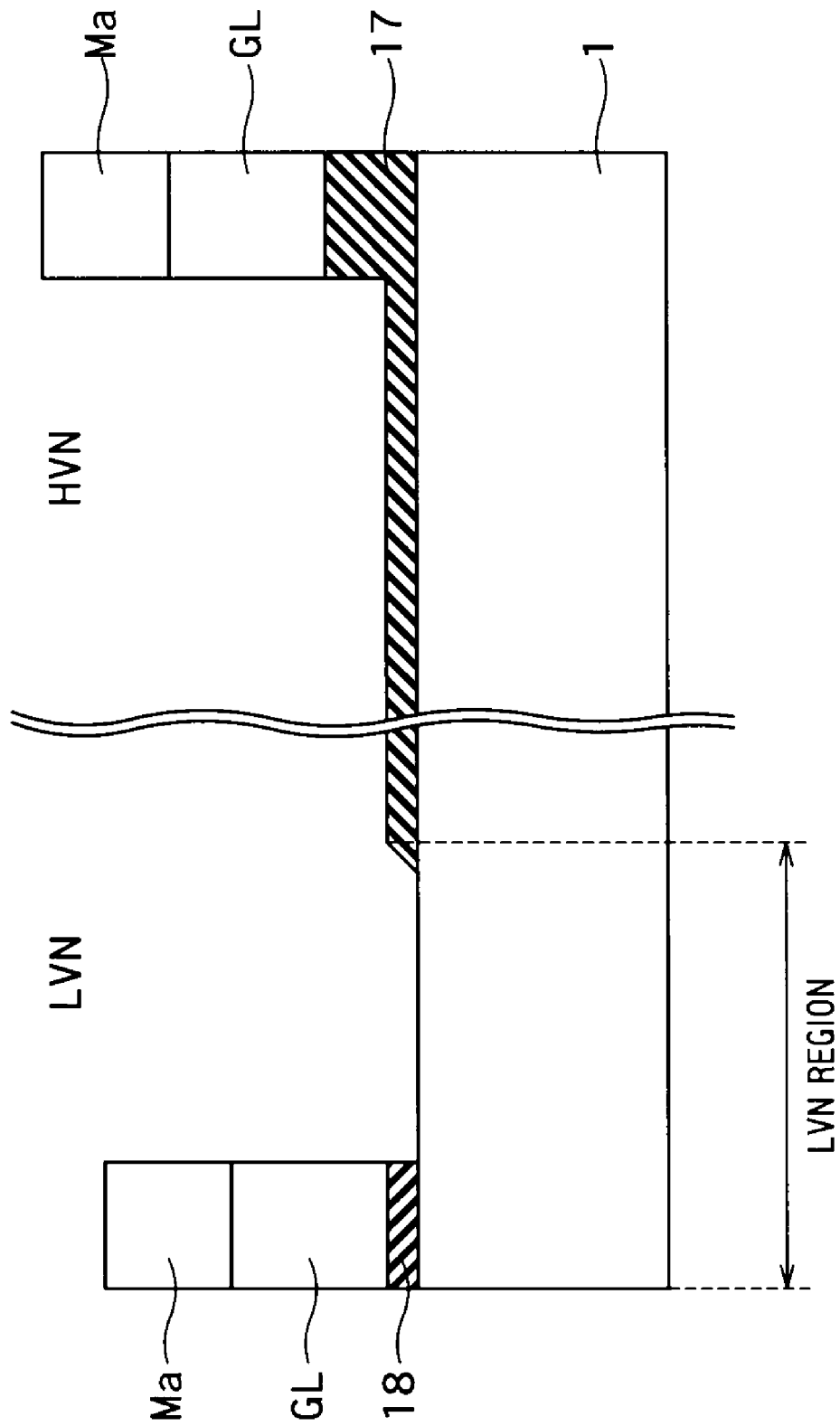
FIG. 7 illustrates a cross-section showing a process after the process of FIG. 6.

As illustrated in FIG. 7, the gate layer GL, the first gate insulating film 17, the second gate insulating film 18, and the semiconductor substrate 1 are etched by an RIE method with the mask material Ma as a mask. At this time, an etching condition is set to a condition that the polycrystalline silicon and silicon are easily etched in etchings of the first gate insulating film 17 and the semiconductor substrate 1, and the etching condition is not changed in etchings of the first gate insulating film 17 and the second gate insulating film 18. As a result, the thicker first gate insulating film 17 is still remained when the thinner second gate insulating film 18 is completely removed, and the first gate insulating film 17 acts as an etching prevention film in etching of the semiconductor substrate 1.

Figure 8:
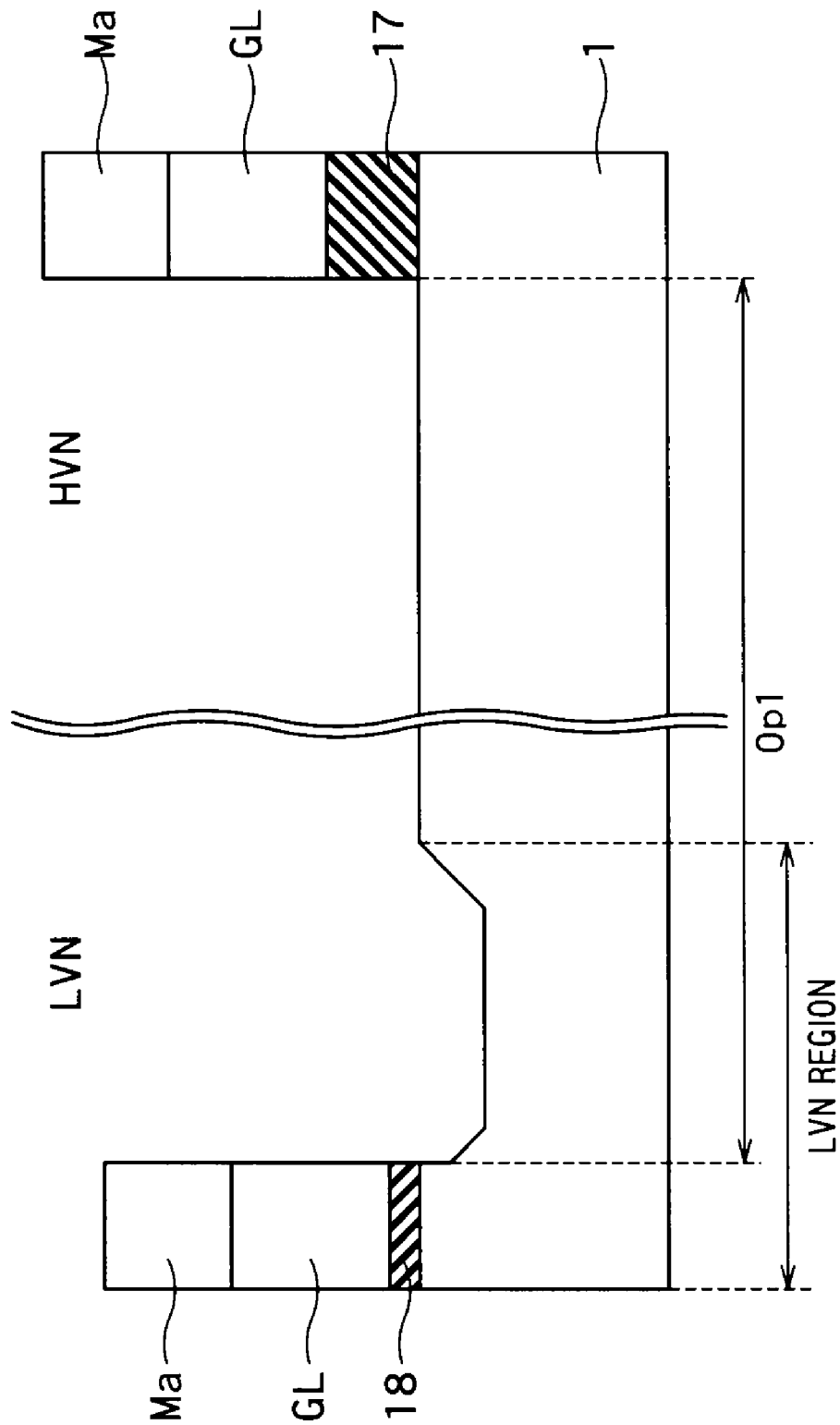
FIG. 8 illustrates a cross-section showing a process after the process of FIG. 7.

As illustrated in FIG. 8, when the first gate insulating film 17 is removed by the etching, the etching of the semiconductor substrate 1 advances to make an opening Op1 in the LVNE region.

When the first gate insulating film 17 is formed by the thermal oxidation method, strictly the bottoms of the first gate insulating film 17 and the second gate insulating film 18 are not flush with each other. However, even if the bottoms of the first gate insulating film 17 and the second gate insulating film 18 are not exactly flush with each other, the semiconductor device of the first embodiment of the present invention can be manufactured if the opening Op1 of FIG. 8 is made.

Figure 9:
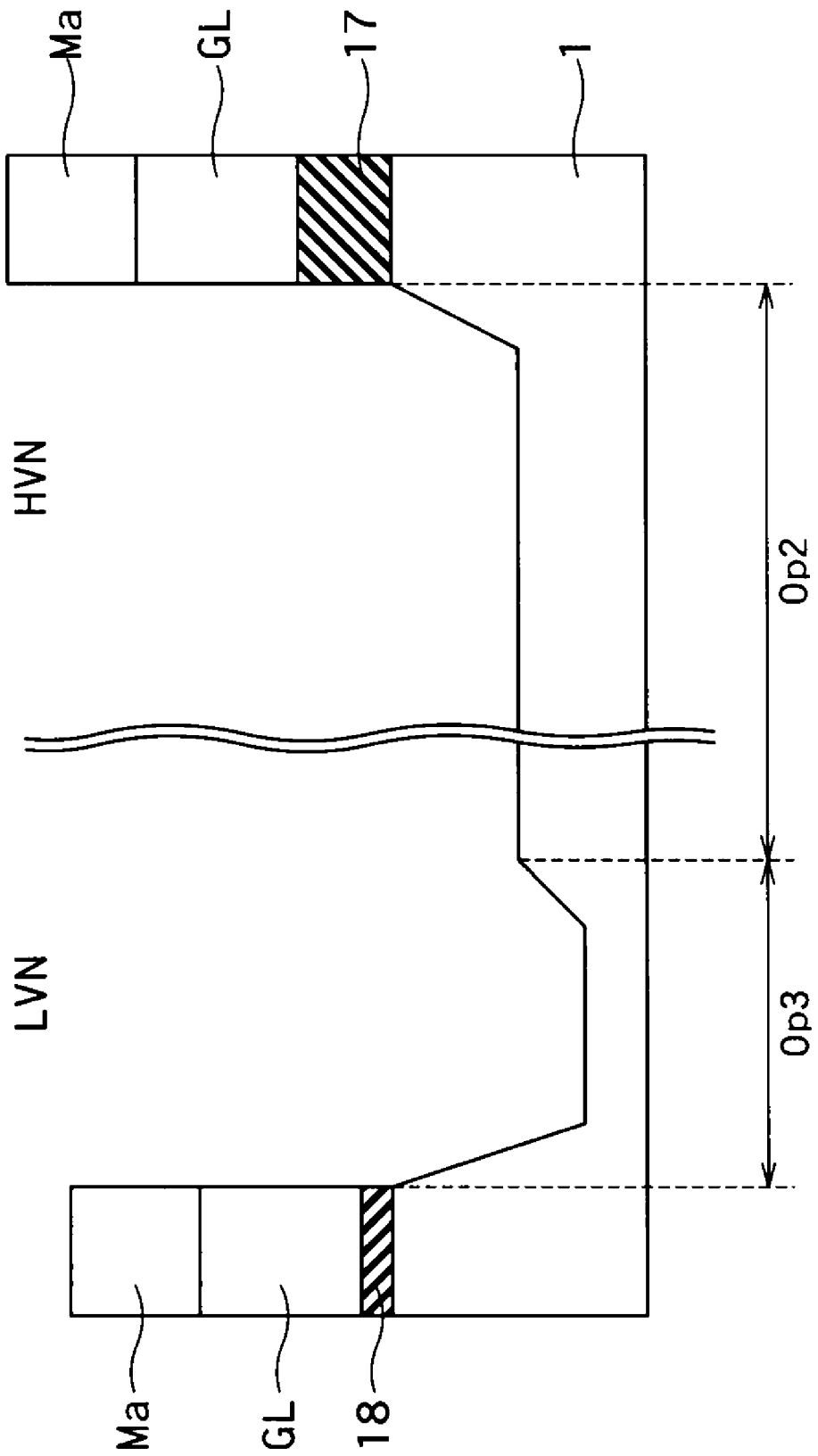
FIG. 9 illustrates a cross-section showing a process after the process of FIG. 8.

Then, as illustrated in FIG. 9, a first opening Op2 is made in the semiconductor substrate 1 below the first gate insulating film 17 by the etching, and a second opening Op3 that is lower than the first opening Op2, is made in the semiconductor substrate 1 below the second gate insulating film 18. That is, the first opening Op2 and the second opening Op3 having different depths (distances from top to bottom) are made in a self-aligned manner without separately making the openings in the photolithography by utilizing a difference in film thickness between the first gate insulating film 17 and the second gate insulating film 18. The first opening Op2 is adjacent to the second opening Op3. For the bottom of the first opening Op2 and the second opening Op3, it is gradually low from the first opening Op2 to the second opening Op3.

Figure 10:
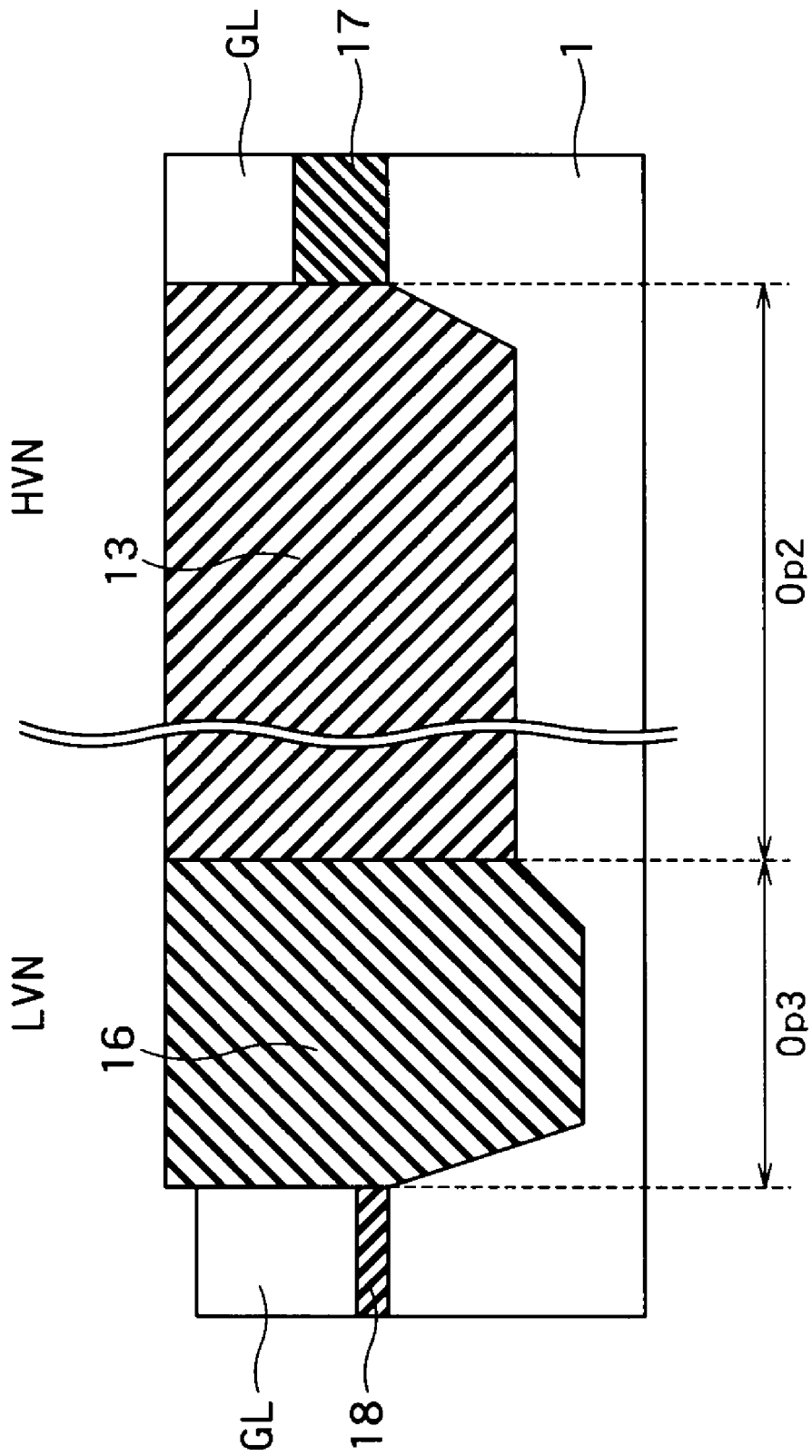
FIG. 10 illustrates a cross-section showing a process after the process of FIG. 9.

As illustrated in FIG. 10, the first opening Op2 and the second opening Op3 are buried by the isolation insulating films made of, for example, silicon oxide or PSZ, and tops of the isolation insulating films are flush with the top of the gate layer GL by a CMP method or a RIE method to remove the mask material Ma. At this time, the isolation insulating film by which the first opening Op2 is buried constitutes the first isolation region 13, and the isolation insulating film by which the second opening Op3 is buried constitutes the second isolation region 16.

An additional gate layer GL is stacked on the gate layer GL, and the first gate electrode 12 and the second gate electrode 15 are formed by processing the gate layer GL after the additional gate layer GL is stacked, then forming the interlayer dielectric film 19. As a result, the semiconductor device of the first embodiment of the present invention is manufactured as illustrated in FIG. 2.

Preferably, a distance d between the second element region 14 and an end portion of the second isolation region 16 in the direction in which the second gate electrode 15 is extended as illustrated in FIG. 1 and (B) of FIG. 6 is narrowed. However, when the distance d is excessively narrowed, the mask material Ma is not included in the LVN region due to a process variation (such as out of tolerances in alignment and size of masks for lithography). As a result, possibly the second gate insulating film 18 formed below the second gate electrode 15 constitutes the first gate insulating film 17. Therefore, preferably the distance d is minimized in consideration of the process variation.

Although the n-type low-voltage transistor (LVN) is described by way of example in the first embodiment of the present invention, the first embodiment of the present invention can also be applied to the p-type low-voltage transistor (LVP) because the crystal defect is generated in the p-type low-voltage transistor (LVP).

According to the first embodiment of the present invention, in the isolation insulating film adjacent to the second element region 14 of the low-voltage transistor LVN, the volume of the whole isolation insulating film is reduced by reducing the area of the second isolation region 16 whose bottom is lower than that of the first isolation region 13, so that the junction leakage of the low-voltage transistor LVN can be reduced.

According to the first embodiment of the present invention, the process for changing the depth of the isolation region by the lithography is not necessary. Because the bottom of second isolation region 16 can be lower than that of the first isolation region 13 by using self-aligned manner that the different film thicknesses of the gate insulating films. Therefore, the effect can be achieved without increasing the number of processes.

Second Embodiment

A semiconductor device according to a second embodiment of the present invention will be described. In the semiconductor device of the second embodiment of the present invention, enhancement type and depletion type transistors are used as the low-voltage transistor. The description of the same contents as the first embodiment of the present invention will not be repeated.

A structure of the semiconductor device of the second embodiment of the present invention will be described with reference to FIGS. 11 and 12.

Figure 11:
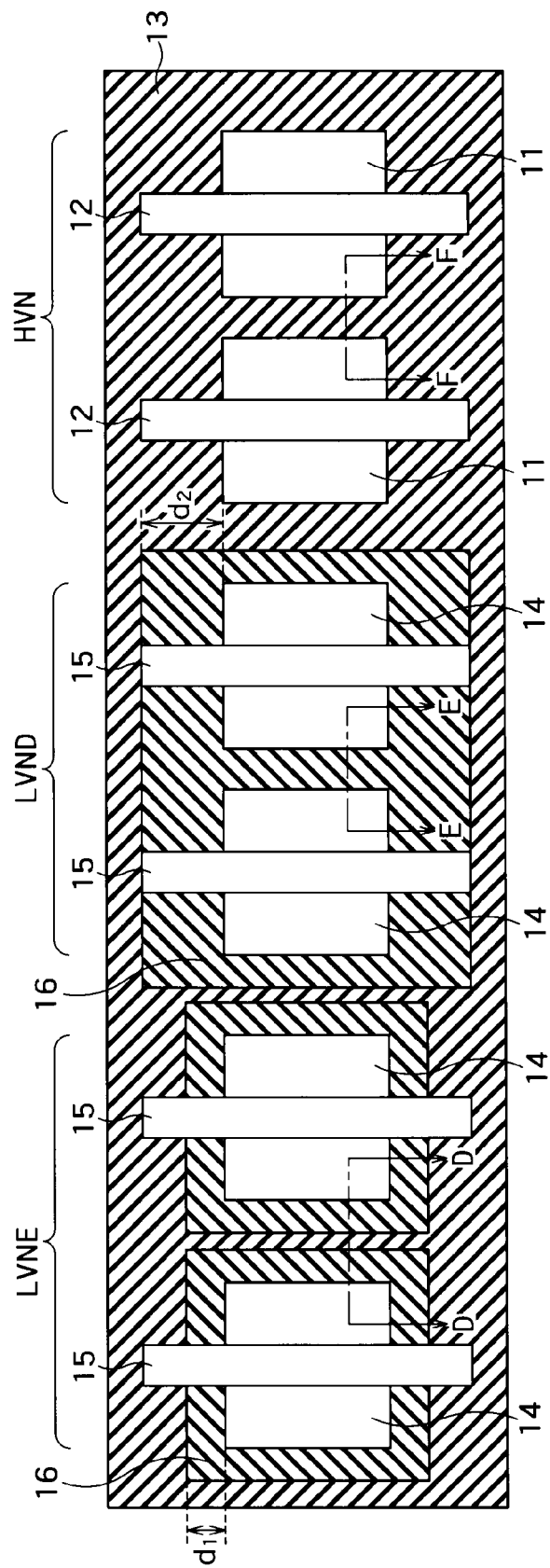
FIG. 11 is a plan view illustrating a planar structure of the semiconductor device of a second embodiment of the present invention.

FIG. 11 is a plan view illustrating a planar structure of the semiconductor device of the second embodiment of the present invention.

The semiconductor device includes two enhancement type low-voltage transistors LVNE, two depletion type low-voltage transistors LVND, and two high-breakdown-voltage transistors HVN. The transistors are disposed adjacent to one another. A concentration of impurities implanted into the semiconductor substrate 1 (hereinafter referred to as "well concentration") of the depletion type low-voltage transistor LVND is lower than that of the enhancement type low-voltage transistor LVNE in order to lower a threshold voltage. For example, the transistor LVND has the well concentration that is substantially equal to that of the semiconductor substrate 1.

The enhancement type low-voltage transistor LVNE includes a second element region 14 surrounded by the second isolation region 16 and the second gate electrode 15 disposed so as to extend from the second element region 14 to the first isolation region 13. The second isolation region 16 is surrounded by the first isolation region 13. The first isolation region 13 is formed between the enhancement type low-voltage transistors LVNE so as to be sandwiched between the second isolation regions 16.

The depletion type low-voltage transistor LVND includes the second element region 14 surrounded by the second isolation region 16 and the second gate electrode 15 disposed so as to extend form the second element region 14 to the second isolation region 16. The first isolation region 13 is not formed between the depletion type low-voltage transistors LVND, but only the second isolation region 16 is formed between the depletion type low-voltage transistors LVND.

The high-voltage transistor HVN includes the first element region 11 surrounded by the first isolation region 13 and the first gate electrode 12 disposed so as to extend from the first element region 11 to the first isolation region 13. The second isolation region 16 is not formed between the high-voltage transistors HVN, but only the first isolation region 13 is formed between the high-voltage transistors HVN.

A distance $d_2$ between the second element region 14 and the end portion of the second isolation region 16 in the direction in which the second gate electrode 15 of the depletion type low-voltage transistor LVND is extended is longer than a distance $d_1$ between the second element region 14 and the end portion of the second isolation region 16 in the direction in which the second gate electrode 15 of the enhancement type low-voltage transistor LVNE is extended.

Figure 12A:
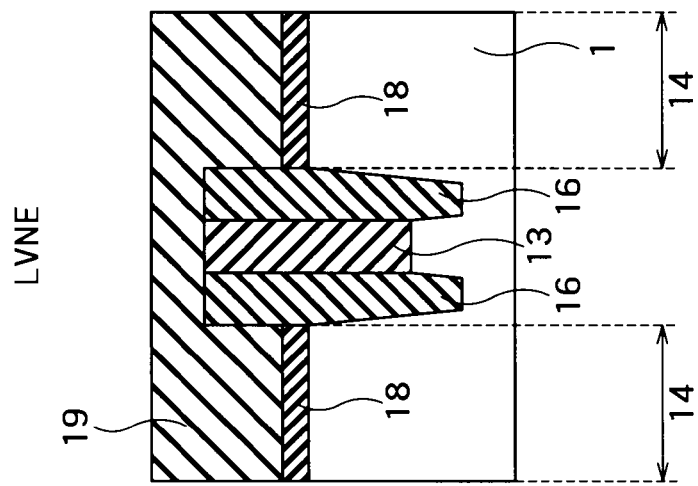
FIG. 12A illustrates a cross-section taken along the line D-D of FIG. 11 of the semiconductor device of a second embodiment of the present invention.
Figure 12B:
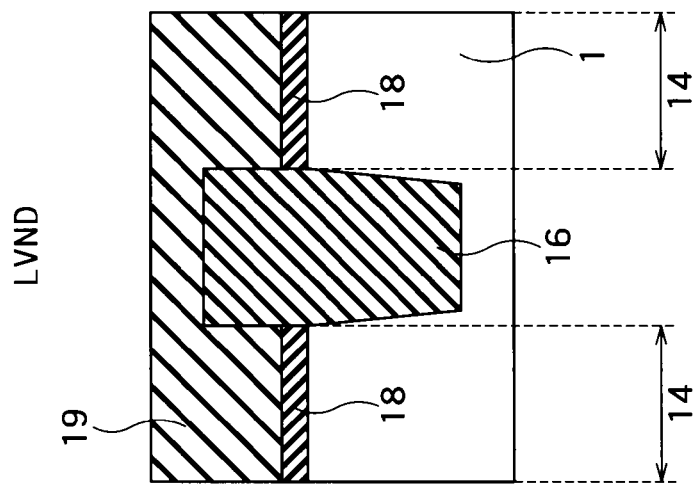
FIG. 12B illustrates a cross-section taken along the line E-E of FIG. 11 of the semiconductor device of a second embodiment of the present invention.
Figure 12C:
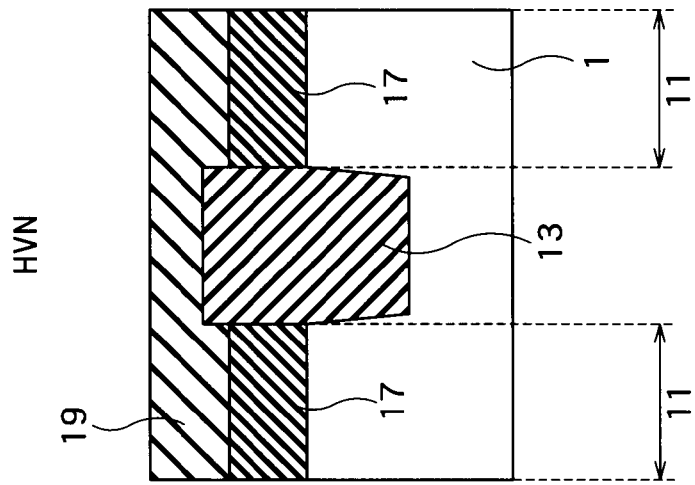
FIG. 12C illustrates a cross-section taken along the line F-F of FIG. 11 of the semiconductor device of a second embodiment of the present invention.

FIGS. 12A to 12C are sectional views taken along a line D-D, a line E-E, and a line F-F of FIG. 11 of the semiconductor device of a second embodiment of the present invention. FIG. 12A illustrates a section taken along the line D-D of FIG. 11 of the semiconductor device of a second embodiment of the present invention, FIG. 12B illustrates a section taken along the line E-E of FIG. 11 of the semiconductor device of a second embodiment of the present invention, and FIG. 12C illustrates a section taken along the line F-F of FIG. 11 of the semiconductor device of a second embodiment of the present invention.

As illustrated in FIG. 12A, the isolation insulating film formed between the enhancement type low-voltage transistors LVNE includes the first isolation region 13 and second isolation regions 16 formed so as to sandwich the first isolation region 13 therebetween. As illustrated in FIG. 12B, the second isolation region 16 is formed between the depletion type low-voltage transistors LVND. As illustrated in FIG. 12C, the first isolation region 13 is formed between the high-voltage transistors HVN.

A method for manufacturing the semiconductor device of the second embodiment of the present invention will be described with reference to FIGS. 13 and 14.

Through the same processes as those of FIGS. 3 to 5 of the first embodiment of the present invention, as illustrated in FIGS. 13A to 13C, the second gate insulating films 18 are formed in the LVNE region and the LVND region, and the first gate insulating film 17 is formed in the HVN region. As illustrated in FIG. 13A, the first gate insulating film 17 is formed between the LVNE regions.

Figure 14C:
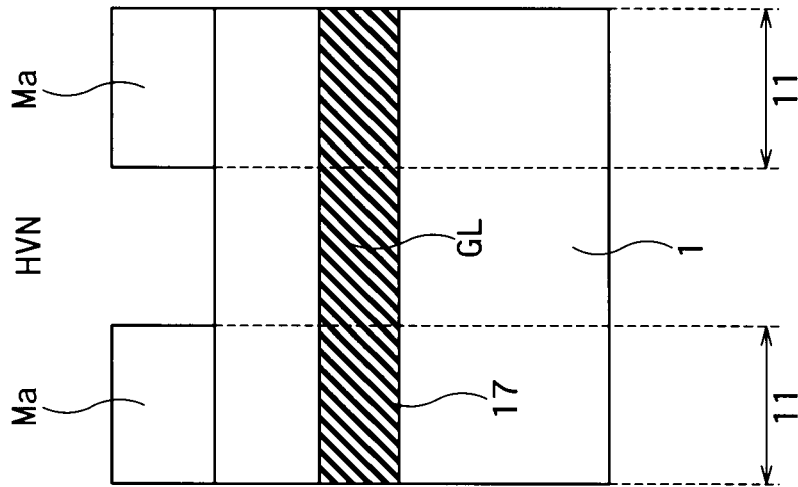
FIGS. 14A to 14C illustrate a cross-section showing a process after the process of FIGS. 13A to 13C.
Figure 14B:
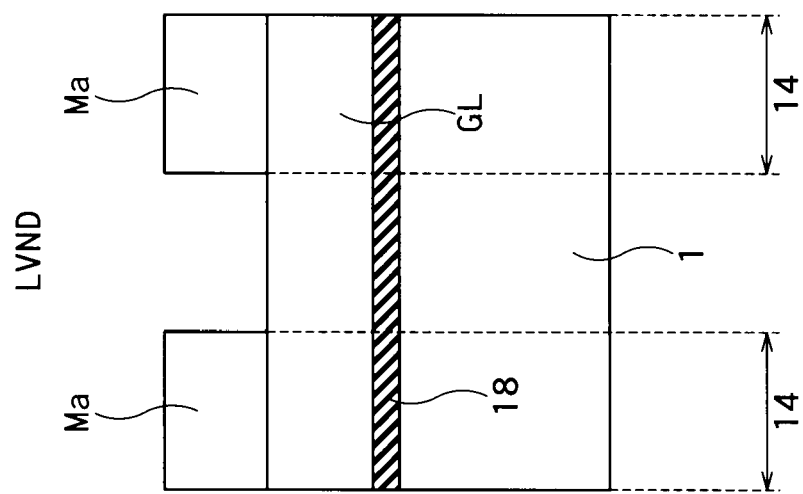
Figure 14A:
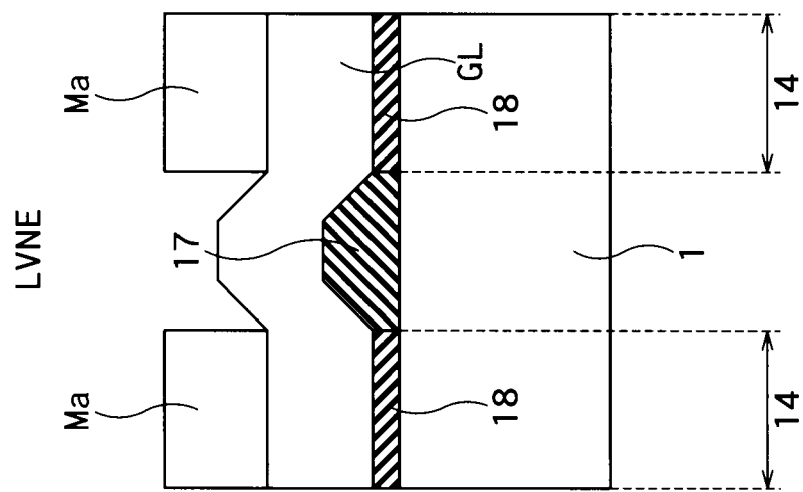

Through the same process as that of FIG. 6 of the first embodiment of the present invention, as illustrated in FIGS. 14A to 14C, the mask materials Ma are formed in the enhancement type low-voltage transistor LVNE and the depletion type low-voltage transistor LVND such that the second element regions 14 are covered with the mask materials Ma, and the mask materials Ma are formed in the high-voltage transistor HVN such that the first element regions 11 are covered with the mask materials Ma.

Through the same processes as those of FIGS. 7 to 9 of the first embodiment of the present invention, the semiconductor device of the second embodiment of the present invention is manufactured as illustrated in FIGS. 12A to 12C.

At this time, the well concentration of the depletion type low-voltage transistor LVND is lower than that of the enhancement type low-voltage transistor LVNE, and a position of junction between a diffusion layer (not shown) and a well (not shown) in the semiconductor substrate 1 is lower than a position where a crystal defect is generated. Therefore, the junction leakage current hardly increases in the depletion type low-voltage transistor LVND. Further, possibly inter-field punch-through reduces because the depletion type low-voltage transistor LVND has the low well concentration. Therefore, preferably a bottom of the isolation insulating film in the depletion type low-voltage transistor LVND is lower than that in the enhancement type low-voltage transistor LVNE.

According to the second embodiment of the present invention, as illustrated in FIGS. 12A and 12B, a bottom of the first isolation region 13 is lower than that of the second isolation region 16, so that the inter-field punch-through can be prevented in the depletion type low-voltage transistor LVND.

Third Embodiment

A semiconductor device according to a third embodiment of the invention of the present invention will be described below. Compared with the semiconductor device of the first embodiment of the present invention, in the semiconductor device of the third embodiment of the present invention, the top of the first gate insulating film is flush with that of the second gate insulating film. The description of the same contents as the first embodiment and the second embodiment of the present invention will not be repeated.

A structure of the semiconductor device of the third embodiment of the present invention will be described with reference to FIG. 15. Because the planar structure of the semiconductor device of the third embodiment of the present invention is similar to that of FIG. 1 in the first embodiment of the present invention, the description will not be repeated.

Figure 15A:
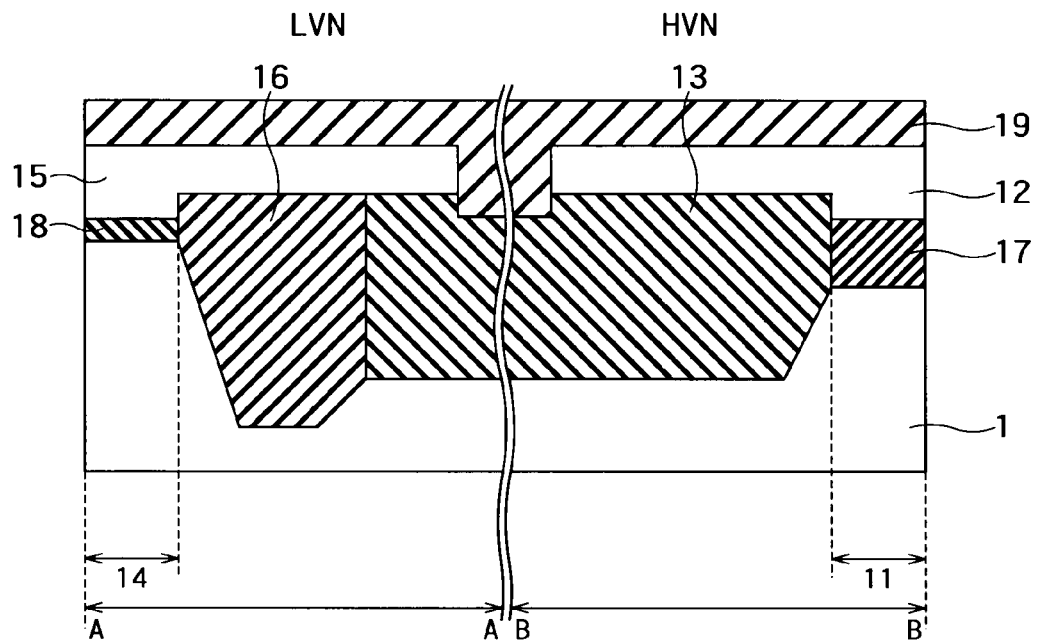
FIGS. 15A and 15B are sectional views illustrating the semiconductor device of a third embodiment of the present invention.
Figure 15B:
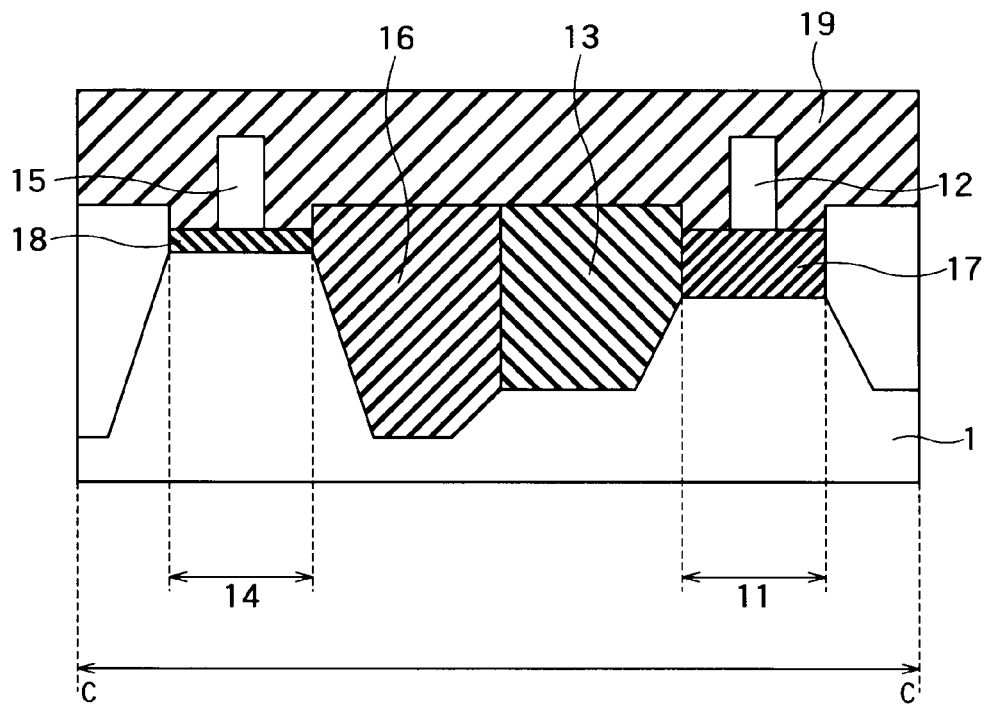

FIGS. 15A and 15B are sectional views illustrating the semiconductor device of the third embodiment of the present invention. FIG. 15A illustrates a section taken along the line A-A and the line B-B of FIG. 1, and FIG. 15B illustrates a section taken along the line C-C of FIG. 1.

In the semiconductor device of the third embodiment of the present invention, the tops of the first gate insulating film 17 and the second gate insulating film 18 are substantially flush with each other unlike the semiconductor device of the first embodiment of the present invention in which the bottoms of the first gate insulating film 17 and the second gate insulating film 18 are substantially flush with each other. Because the tops of the first gate insulating film 17 and the second gate insulating film 18 are flush with each other, the positions of the bottoms of the first isolation region 13 and the second isolation region 16 are determined based on the positions of the tops of the first gate insulating film 17 and the second gate insulating film 18.

A method for manufacturing the semiconductor device of the third embodiment of the present invention will be described with reference to FIGS. 16 to 21.

Figure 16:
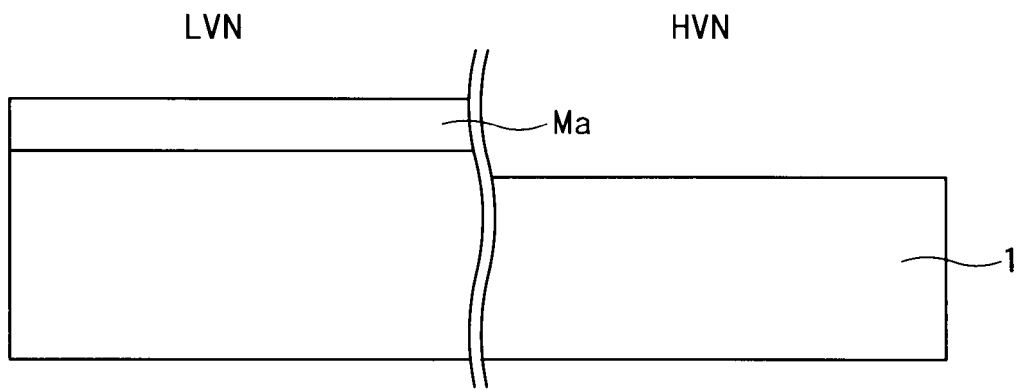
FIG. 16 illustrates a cross-section showing a process of a method for manufacturing a semiconductor device of a third embodiment of the present invention.

As illustrated in FIG. 16, the mask material Ma is formed on the semiconductor substrate 1 on the side of the low-voltage transistor LVN. Then, the semiconductor substrate 1 on the side of the high-voltage transistor HVN is etched using an etching technique such as the RIE method and wet etching. The etched amount is adjusted such that the tops of the first gate insulating film 17 and the second gate insulating film 18 are substantially flush with each other.

Figure 17:
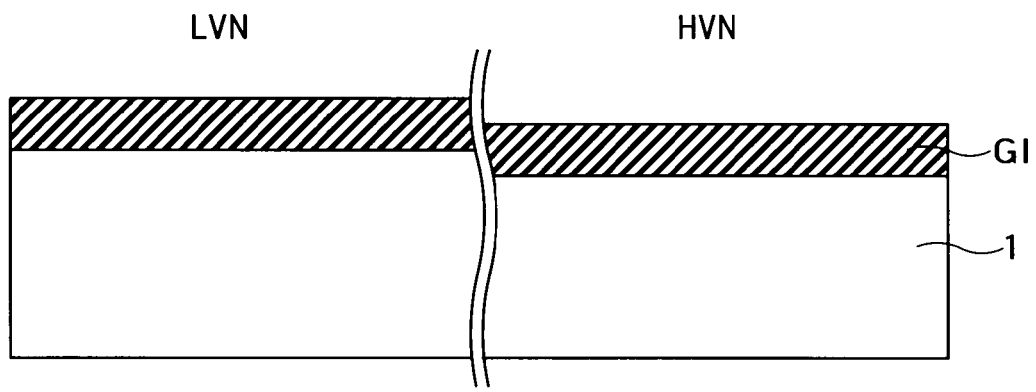
FIG. 17 illustrates a cross-section showing a process after the process of FIG. 16.

As illustrated in FIG. 17, the mask material Ma on the semiconductor substrate 1 on the side of the low-voltage transistor LVN is removed. Then, the insulating film is deposited in the whole surface of the semiconductor substrate 1 by, for example, the thermal oxidation method, thereby forming the gate insulating film GI.

Figure 18:
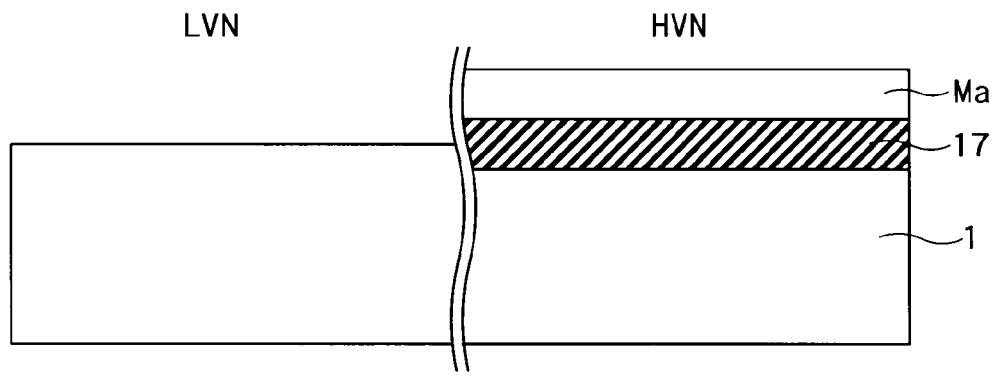
FIG. 18 illustrates a cross-section showing a process after the process of FIG. 17.

As illustrated in FIG. 18, the mask material Ma is formed on the semiconductor substrate 1 on the side of the high-voltage transistor HVN. Then, the gate insulating film GI on the semiconductor substrate 1 on the side of the low-voltage transistor LVN is etched using the etching technique such as the RIE method and the wet etching. As a result, the gate insulating film GI on the semiconductor substrate 1 on the side of the high-voltage transistor HVN constitutes the first gate insulating film 17.

Figure 19:
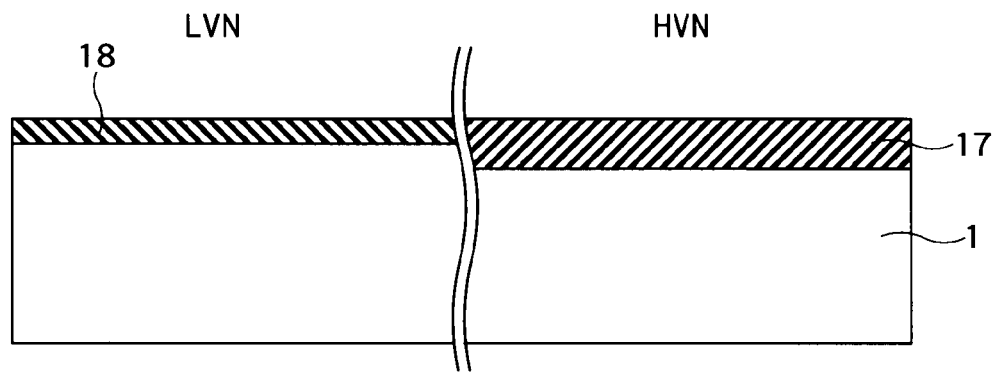
FIG. 19 illustrates a cross-section showing a process after the process of FIG. 18.

As illustrated in FIG. 19, an additional insulating film that is thinner than the first gate insulating film 17 is deposited on the semiconductor substrate 1 on the side of the low-voltage transistor LVN by, for example, the thermal oxidation method. As a result, the insulating film on the semiconductor substrate 1 on the side of the low-voltage transistor LVN constitutes the second gate insulating film 18. Then, the mask material Ma on the semiconductor substrate 1 on the side of the high-voltage transistor HVN is removed. At this time, the second gate insulating film 18 is formed so as to be substantially flush with the top of the first gate insulating film 17.

Figure 20:
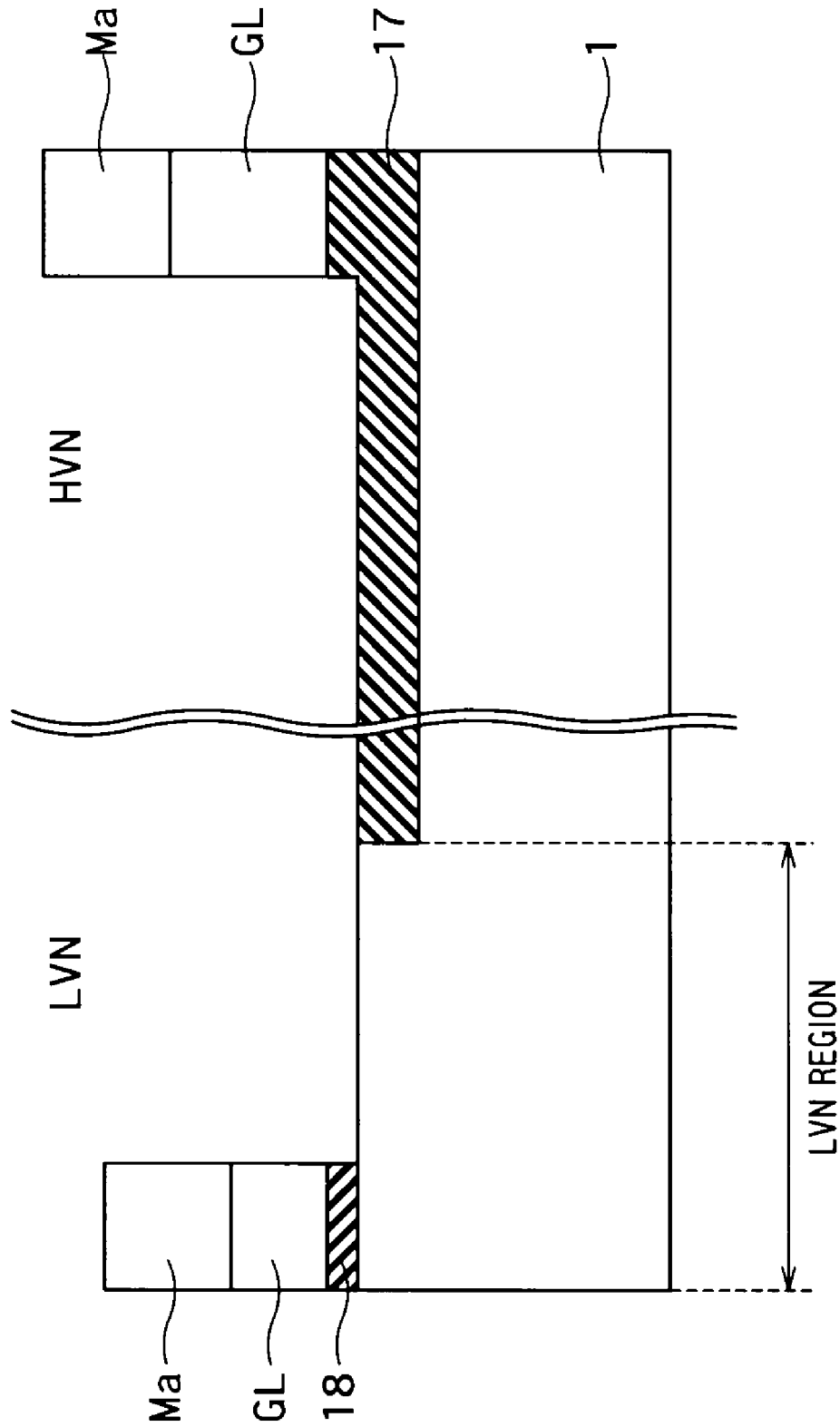
FIG. 20 illustrates a cross-section showing a process after the process of FIG. 19.

Through the same process as that of FIG. 6 of the first embodiment of the present invention, as illustrated in FIG. 20, the etching is performed with the mask material Ma as the mask until the second gate insulating film 18 is removed in the LVN region. At this time, in the first gate insulating film 17, only an upper portion is partially removed because the thickness of the first gate insulating film 17 is larger than that of the second gate insulating film 18, and a lower portion is remained.

Figure 21:
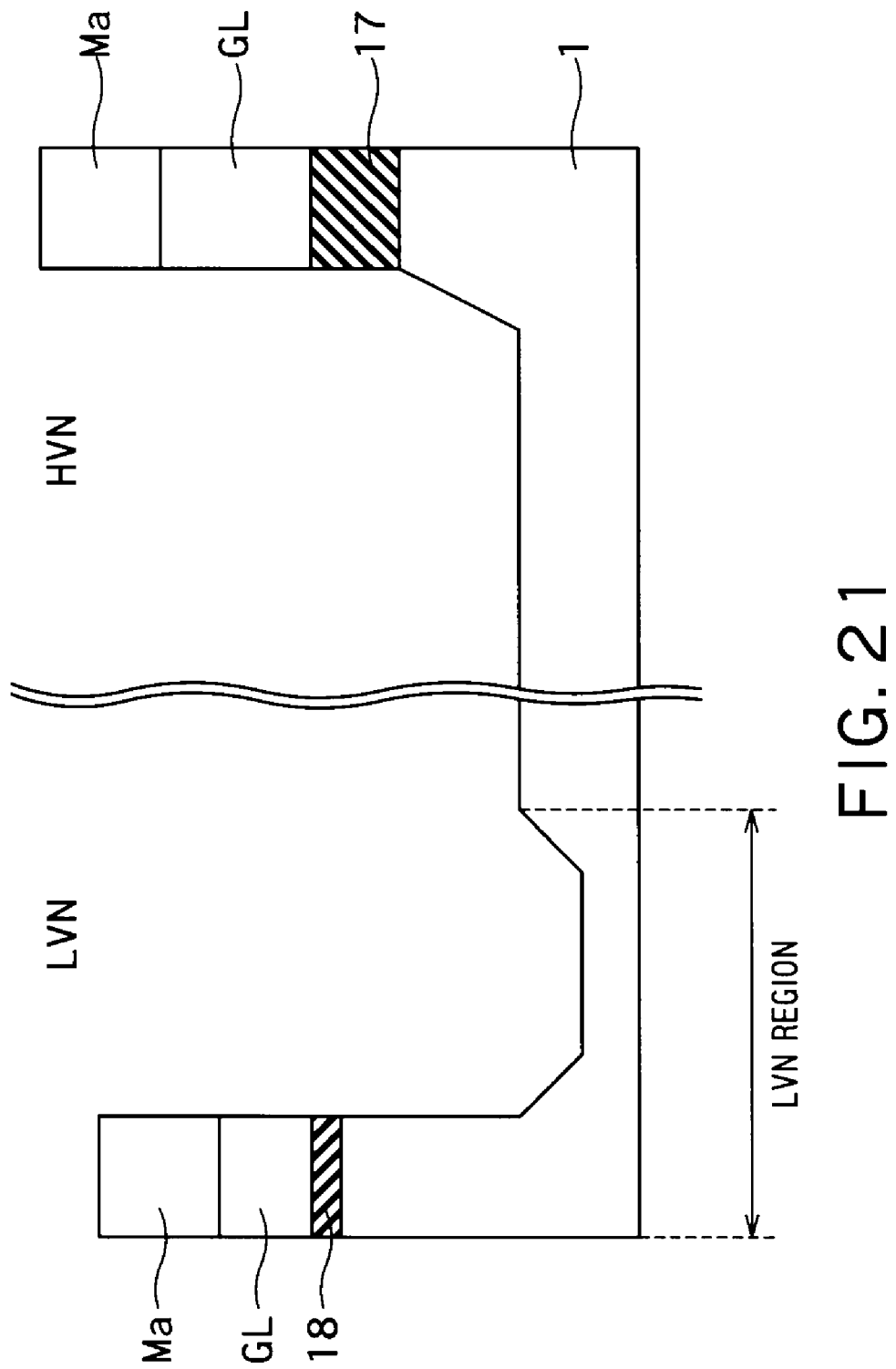
FIG. 21 illustrates a cross-section showing a process after the process of FIG. 20.

The etching condition is switched to the condition in which an etching rate of the semiconductor substrate 1 is higher than that of the first gate insulating film 17. At this time, the first gate insulating film 17 acts as a stopper film that delays the etching. As a result, at a time the first gate insulating film 17 is removed, as illustrated in FIG. 21, the opening of the semiconductor substrate 1 on the LVN side (in the LVN region) is deeper than that on the HVN side. That is, the bottom of the isolation insulating film on the LVN side is lower than that on the HVN side.

Then, through the same process as that of FIG. 10 of the first embodiment of the present invention, the semiconductor device of the third embodiment of the present invention is manufactured as illustrated in FIG. 15.

According to the third embodiment of the present invention, in addition to the effect similar to that of the first embodiment of the present invention, the top of the first gate electrodes 12 and the second gate electrode 15 is substantially flush with each other, so that the tops of the gate layers GL on the LVN side and the HVN side can be flush with each other in forming the mask material Ma. Therefore, a margin for processing is improved.

Fourth Embodiment

A semiconductor device according to a fourth embodiment of the invention of the present invention will be described below. In the semiconductor device of the fourth embodiment of the present invention, the semiconductor device of the second embodiment of the present invention is applied to the semiconductor device of the third embodiment of the present invention. The description of the same contents as the first to third embodiments of the present invention will not be repeated.

A structure of the semiconductor device of the fourth embodiment of the present invention will be described with reference to FIG. 22. Because the planar structure of the semiconductor device of the fourth embodiment of the present invention is similar to that of FIG. 11 of the second embodiment of the present invention, the description will not be repeated.

Figure 22A:
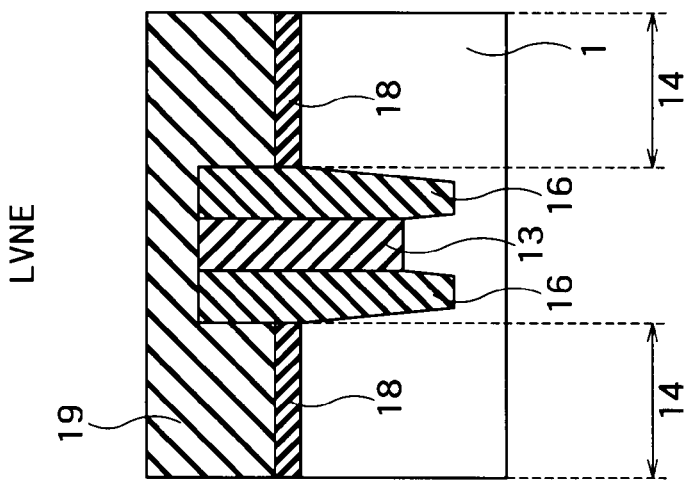
FIG. 22A illustrates a section taken along the line D-D of FIG. 11 of the semiconductor device of the forth embodiment of the present invention.
Figure 22B:
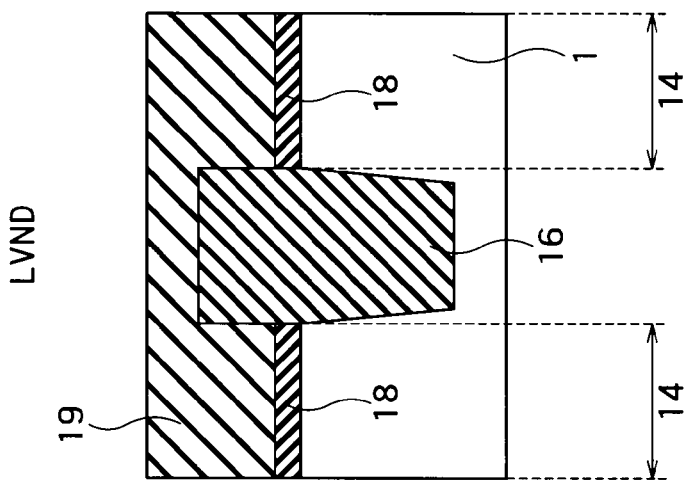
FIG. 22B illustrates a section taken along the line E-E of FIG. 11 of the semiconductor device of the forth embodiment of the present invention.
Figure 22C:
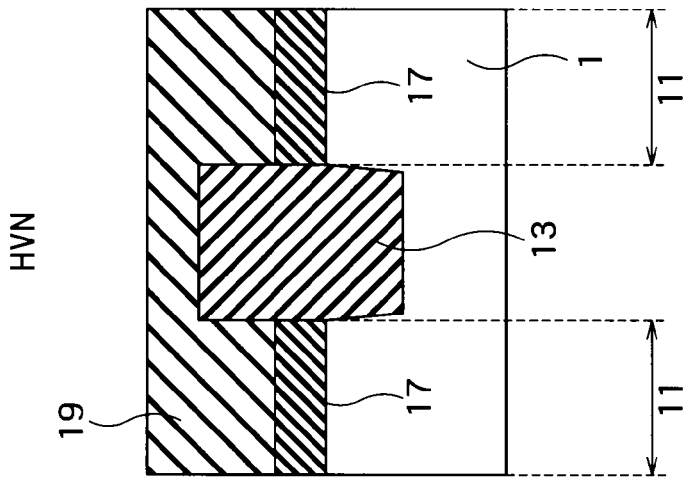
FIG. 22C illustrates a section taken along the line F-F of FIG. 11 of the semiconductor device of a forth embodiment of the present invention.

FIGS. 22A to 22C are sectional views illustrating the semiconductor device of the fourth embodiment of the present invention. FIG. 22A illustrates a section taken along the line D-D of FIG. 11 of the semiconductor device of the forth embodiment of the present invention, FIG. 22B illustrates a section taken along the line E-E of FIG. 11 of the semiconductor device of the forth embodiment of the present invention, and FIG. 22C illustrates a section taken along the line F-F of FIG. 11 of the semiconductor device of the forth embodiment of the present invention.

In the semiconductor device of the fourth embodiment of the present invention, the tops of the first gate insulating film 17 and the second gate insulating film 18 are substantially flush with each other unlike the semiconductor device of the second embodiment of the present invention in which the bottoms of the first gate insulating film 17 and the second gate insulating film 18 are substantially flush with each other. Because the tops of the first gate insulating film 17 and the second gate insulating film 18 are flush with each other, at the positions of the bottoms of the first isolation region 13 and second isolation region 16 are determined based on the positions of the tops of the first gate insulating film 17 and second gate insulating film 18.

According to the fourth embodiment of the present invention, the effect similar to those of the first to third embodiments of the present invention is obtained.

What is claimed is:

1. A semiconductor device with a high-voltage transistor and a low-voltage transistor, comprising:
    an isolation insulating film between a first element region of the high-voltage transistor and a second element region of the low-voltage transistor;
    a first gate insulating film on a semiconductor substrate in the first element region;
    a first gate electrode on the first gate insulating film;
    a second gate insulating film on the semiconductor substrate in the second element region; and
    a second gate electrode on the second gate insulating film,
    wherein the isolation insulating film comprises a first isolation region adjacent to the first element region and a second isolation region adjacent to the second element region, a bottom of the second isolation region being lower than a bottom of the first isolation region, and the first gate insulating film being thicker than the second gate insulating film,
    wherein a top of the first gate insulating film is flush with a top of the second gate insulating film.

2. The device of claim 1, wherein
    the low-voltage transistor comprises an enhancement type low-voltage transistor and a depletion type low-voltage transistor, and
    the second isolation region comprises a depletion-side isolation region and an enhancement-side isolation region, the depletion-side isolation region being adjacent to the depletion type low-voltage transistor, the enhancement-side isolation region being adjacent to the enhancement type low-voltage transistor, and
    the depletion-side isolation region is larger than the enhancement-side isolation region.

3. The device of claim 2, wherein the enhancement type low-voltage transistor comprises a plurality of enhancement-type low-voltage transistor parts, the depletion type low-voltage transistor comprises a plurality of depletion type low-voltage transistor parts, and the high-voltage transistor comprises a plurality of high-voltage transistor parts,
    the isolation insulating film between the enhancement type low-voltage transistor parts comprises a third isolation region sandwiched between the enhancement-side isolation regions, a bottom of the third isolation region being lower than a bottom of the enhancement-side isolation region,
    the depletion-side isolation region is formed between the depletion type low-voltage transistor parts, and
    the first isolation region is formed between the high-voltage transistor parts.

4. The device of claim 3, wherein a well concentration of the depletion type low-voltage transistor parts is lower than that of the enhancement type low-voltage transistor parts.

5. The device of claim 1, wherein the first isolation region is adjacent to the second isolation region, and
    a bottom of the first and second isolation regions is gradually low from the first isolation region to the second isolation region.

* * * * *